(12) United States Patent
Jacobson et al.

(10) Patent No.: US 7,646,255 B2
(45) Date of Patent: Jan. 12, 2010

(54) VOLTAGE CONTROLLED OSCILLATOR MODULE WITH BALL GRID ARRAY RESONATOR

(75) Inventors: Robert A. Jacobson, Orland Park, IL (US); Elisio C. Das Neves, Sycamore, IL (US); Glen Reeser, Palatine, IL (US); Thomas A. Knecht, Dundee, IL (US)

(73) Assignee: CTS Corporation, Elkhart, IN (US)

( * ) Notice: Subject to any disclaimer, the term of this patent is extended or adjusted under 35 U.S.C. 154(b) by 43 days.

(21) Appl. No.: 11/985,132

(22) Filed: Nov. 14, 2007

(65) Prior Publication Data

US 2008/0116981 A1 May 22, 2008

Related U.S. Application Data

(60) Provisional application No. 60/859,691, filed on Nov. 17, 2006, provisional application No. 60/875,445, filed on Dec. 18, 2006.

(51) Int. Cl.
*H03B 5/12* (2006.01)

(52) U.S. Cl. ............................... 331/108 D; 331/117 R; 331/177 V

(58) Field of Classification Search .................... 331/17, 331/18, 25, 36 C, 68, 96, 107 DP, 107 SL, 331/108 D, 117 R, 117 FE, 117 D, 167, 168, 331/177 V, 187; 333/219, 235
See application file for complete search history.

(56) References Cited

U.S. PATENT DOCUMENTS

| | | |
|---|---|---|
| 4,431,977 A | 2/1984 | Sokola et al. |
| 4,551,696 A | 11/1985 | Moutrie et al. |
| 4,571,558 A | 2/1986 | Gay et al. |
| 4,609,892 A | 9/1986 | Higgins, Jr. |
| 4,785,271 A | 11/1988 | Higgins, Jr. |
| 4,940,955 A | 7/1990 | Higgins, Jr. |
| 4,963,843 A | 10/1990 | Peckham |
| 5,057,803 A | 10/1991 | Ooi et al. |

(Continued)

FOREIGN PATENT DOCUMENTS

EP 0 675 539 A 10/1995

(Continued)

OTHER PUBLICATIONS

Pergola L. et al: "An LTCC-based 5-6 GHZ Receiver with Integrated Antenna," 7th European Conference On Wireless Technology, 2004, Amsterdam, The Netherlands; Oct. 11-12, 2004, Piscataway, NJ, USA IEEE, Oct. 11, 2004, pp. 165-168, XP010771265 ISBN: 1-58053-991-2.

(Continued)

*Primary Examiner*—David Mis
(74) *Attorney, Agent, or Firm*—Daniel J. Deneufbourg

(57) ABSTRACT

A voltage controlled oscillator (VCO) assembly and module incorporating a ball grid array resonator as part of the tank circuit of the voltage controlled oscillator. The VCO module preferably incorporates at least an oscillator circuit, the tank circuit, and an output buffer stage circuit all defined by a plurality of interconnected electrical/electronic components including the ball grid array resonator which are mounted to a printed circuit board. In another embodiment, the oscillator assembly also includes a phase-locked loop circuit defined at least in part by an integrated circuit mounted to the printed circuit board.

4 Claims, 11 Drawing Sheets

U.S. PATENT DOCUMENTS

| | | | |
|---|---|---|---|
| 5,153,542 A | 10/1992 | Tai et al. |
| 5,160,905 A | 11/1992 | Hoang |
| 5,160,906 A | 11/1992 | Siomkos et al. |
| 5,349,315 A | 9/1994 | Ala-Kojola |
| 5,416,454 A | 5/1995 | McVeety |
| 5,486,799 A | 1/1996 | Komazaki et al. |
| 5,487,211 A | 1/1996 | Haas et al. |
| 5,642,265 A | 6/1997 | Bond et al. |
| 5,717,245 A | 2/1998 | Pedder |
| 5,812,037 A | 9/1998 | Block |
| 5,977,863 A | 11/1999 | Bloom et al. |
| 5,994,978 A | 11/1999 | Vangala |
| 6,005,777 A | 12/1999 | Bloom et al. |
| 6,097,277 A | 8/2000 | Ginn et al. |
| 6,194,979 B1 | 2/2001 | Bloom et al. |
| 6,218,729 B1 | 4/2001 | Zavrel, Jr. et al. |
| 6,246,312 B1 | 6/2001 | Poole et al. |
| 6,323,824 B1 | 11/2001 | Heinrichs et al. |
| 6,326,677 B1 | 12/2001 | Bloom et al. |
| 6,329,890 B1 | 12/2001 | Brooks et al. |
| 6,362,525 B1 | 3/2002 | Rahim |
| 6,559,735 B1 | 5/2003 | Hoang et al. |
| 6,577,225 B1 | 6/2003 | Poole |
| 6,593,819 B2 | 7/2003 | Lazarescu et al. |
| 6,661,295 B2 | 12/2003 | Knecht et al. |
| 6,700,448 B1 | 3/2004 | Knecht et al. |
| 6,791,403 B1 | 9/2004 | Tayrani et al. |
| 6,825,734 B2 | 11/2004 | Clark |
| 6,856,516 B2 | 2/2005 | Ernsberger et al. |
| 6,882,266 B2 | 4/2005 | Christian et al. |
| 6,897,761 B2 | 5/2005 | Ernsberger et al. |
| 6,900,708 B2 | 5/2005 | White et al. |
| 6,946,733 B2 | 9/2005 | Poole et al. |
| 6,963,265 B2 | 11/2005 | Cooper et al. |
| 7,015,060 B1 | 3/2006 | Kubena et al. |
| 7,068,124 B2 | 6/2006 | White et al. |
| 7,095,372 B2 | 8/2006 | Soler Castany et al. |
| 2002/0084106 A1 | 7/2002 | Inoue et al. |
| 2004/0000701 A1 | 1/2004 | White et al. |
| 2004/0000968 A1 | 1/2004 | White et al. |
| 2004/0160283 A1 | 8/2004 | Walter et al. |
| 2005/0090222 A1 | 4/2005 | Knecht et al. |
| 2005/0190017 A1 | 9/2005 | Hirabayashi |
| 2007/0069835 A1* | 3/2007 | Kamgaing ............... 333/185 |
| 2007/0109076 A1 | 5/2007 | Knecht et al. |
| 2008/0106356 A1 | 5/2008 | Knecht et al. |

FOREIGN PATENT DOCUMENTS

| | | |
|---|---|---|
| EP | 0 854 567 A | 7/1998 |
| JP | 2003 309483 A | 10/2003 |
| WO | WO 99/45634 A | 9/1999 |
| WO | WO 01/95679 A | 12/2001 |

OTHER PUBLICATIONS

Lark Engineering Company, Surface Mount Combline Filters advertisement, RF Design Magazine, Apr. 2005, p. 7 Penton Media, Park, Kansas, U.S.A.

Reactel, Ultra Miniature Combline Filter advertisement, publication unknown, date unknown, page number unknown, publisher and city unknown, U.S.A.

Den Otter, Adrianus., PCT International Search Report mailed Jun. 21, 2007 re: International Application No. PCT/US2006/044180 filed Nov. 14, 2006.

Den Otter, Adrianus., PCT Written Opinion of the International Searching Authority mailed Jun. 21, 2007 re: International Application No. PCT/US2006/044180 filed Nov. 14, 2006.

Robinson, Victoria., PCT International Search Report mailed Jun. 12, 2008 re: International Application No. PCT/US2007/023861 filed Nov. 14, 2007.

Robinson, Victoria., PCT Written Opinion of the International Searching Authority mailed Jun. 12, 2008 re: International Application No. PCT/US2007/023861 filed Nov. 14, 2007.

* cited by examiner

US 7,646,255 B2

VOLTAGE CONTROLLED OSCILLATOR MODULE WITH BALL GRID ARRAY RESONATOR

CROSS-REFERENCE TO RELATED APPLICATIONS

This application claims the benefit of U.S. Provisional Application Ser. No. 60/859,691, filed on Nov. 17, 2006 and U.S. Provisional Application Ser. No. 60/875,445, filed on Dec. 18, 2006, both of which are explicitly incorporated herein by reference as are all references cited therein.

FIELD OF THE INVENTION

This invention relates generally to voltage controlled oscillators and, more specifically, to a voltage controlled oscillator incorporating a ball grid array resonator.

BACKGROUND OF THE INVENTION

Voltage controlled oscillators incorporating coaxial resonators have proven to be effective for a variety of applications up to frequencies of 1.5 GHz and bandwidths up to 3%. There remains, however, a need for a voltage controlled oscillator operable at frequencies greater than 1.5 GHz and bandwidths greater than about 3%.

The present invention addresses this need by incorporating a ball grid array resonator into the tank circuit of a voltage controlled oscillator.

SUMMARY OF THE INVENTION

This invention is directed to an electronic voltage controlled oscillator module or assembly which comprises a voltage controlled oscillator defined by a plurality of components mounted on a printed circuit board and adapted to generate a frequency signal.

Specifically, and in accordance with the present invention, the voltage controlled oscillator is defined at least in part by a tank circuit which is defined on the printed circuit board and includes a ball grid array resonator mounted to the printed circuit board and associated with the voltage controlled oscillator for generating the frequency signal.

In one embodiment, the tank circuit includes first and second varactors, first and second capacitors, and the ball grid array resonator, all of which are mounted to the printed circuit board. The first varactor is in series with the ball grid array resonator and in parallel with both the second varactor and the second capacitor. The second capacitor is in series with and between the first and second varactors.

In another embodiment, the tank circuit includes first and second capacitors, a first varactor, and the resonator, all mounted to the printed circuit board. The first capacitor is in series with the ball grid array resonator, the first varactor is in parallel with the first capacitor and the resonator, and the second capacitor is in series between the first varactor and the first capacitor.

In a presently preferred embodiment, the tank circuit includes a varactor mounted to the printed circuit board and positioned in series with the ball grid array resonator and a capacitor mounted to the printed circuit board and positioned in parallel with both the varactor and the ball grid array resonator.

In another embodiment, the assembly also comprises a phase-locked loop circuit also defined by one or more electrical components including an IC which is mounted to the printed circuit board and is electrically connected to the voltage controlled oscillator and the tank circuit.

A lid is adapted to cover all of the components mounted on the top face of the printed circuit board.

There are other advantages and features that will be more readily apparent from the following description of the invention, the drawings, and the appended exemplary claims.

BRIEF DESCRIPTION OF THE DRAWINGS

In the accompanying drawings that form part of the specification, and in which like numerals are employed to designate like parts throughout the same.

DETAILED DESCRIPTION OF THE PREFERRED EMBODIMENTS

Figure 1:
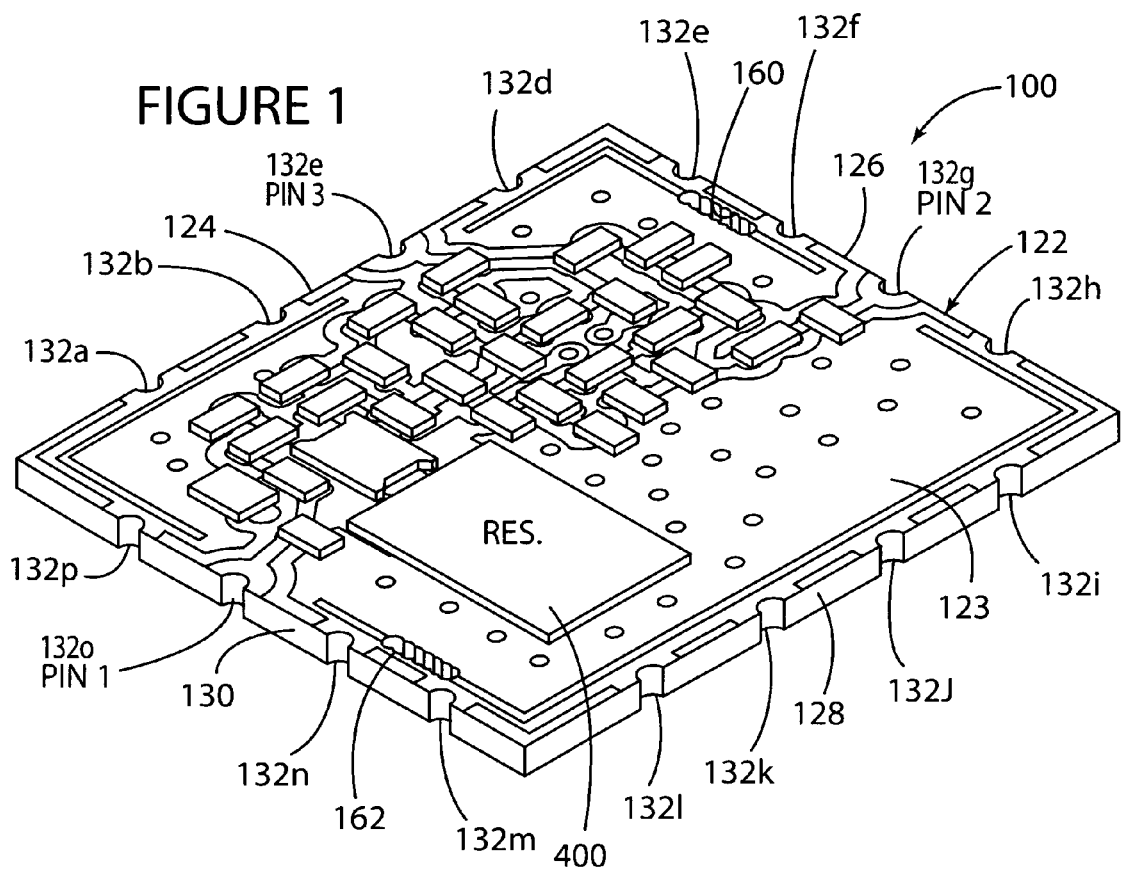
FIG. 1 is an enlarged perspective view of the top face of a voltage controlled oscillator module of the present invention without a lid thereon.

While this invention is susceptible to embodiments in many different forms, this specification and the accompanying drawings disclose only two preferred embodiments as examples of the present invention. The invention is not intended, however, to be limited to the embodiments so described.

In the figures, a single block or cell may indicate several individual components and/or circuits that collectively perform a single function. Likewise, a single line may represent several individual signals or energy transmission paths for performing a particular operation.

FIGS. 1-8 depict a voltage controlled oscillator module or assembly, generally designated 100, in accordance with the present invention which is adapted for use in, for example, wireless infrastructure base stations and in various "point to point" and "point to multipoint" systems operating at frequencies between about 1 GHz and 6 GHz and bandwidths between about 3% and 20%.

The module or assembly 100, which has a size of about 12.85 mm (l)×12.85 mm (W)×4.3 mm (h) (maximum), includes a generally square-shaped printed circuit board 122 including a top face 123 on which all of the electrical and electronic components defining the oscillator are appropriately mounted and interconnected together with a metal lid or shield 127 (FIG. 4) which covers all of the components. Although not shown, it is understood that the printed circuit board 122 is a GETEK™ board made of a plurality of conventional electrically insulative laminates (three are preferable for this design).

Printed circuit board 122 (FIGS. 1-4) includes respective front and back (top and bottom) faces 123 and 125 and respective elongate side peripheral edges 124, 126, 128 and 130.

A first plurality of castellations 132a-d (FIG. 2) defining direct surface mount pads or pins are formed and extend along the length of the board side edge 124 of the board 122 in spaced-apart and parallel relationship from board side edge 130 to board side edge 126.

A second plurality of castellations 132e-h (FIG. 2), also defining respective direct surface mount pads or pins are formed and extend along the length of the board side edge 126 in spaced-apart and parallel relationship from board side edge 124 to board side edge 128.

A third plurality of castellations 132i-l (FIG. 2), also defining respective direct surface mount pads or pins, are formed and extend along the length of board side edge 128 in a spaced apart and parallel relationship from board side edge 126 to board side edge 130 in a diametrically opposed relationship to castellations 132a-d extending along opposed board side edge 124.

A fourth plurality of castellations 132m-p (FIG. 2), also defining respective direct surface mount pads or pins, are formed and extend along the length of the board side edge 130 in a spaced-apart and parallel relationship from board side edge 128 to board side edge 124 in a diametrically opposed relationship to castellations 132e-h extending along the opposed board side edge 126.

Figure 4:
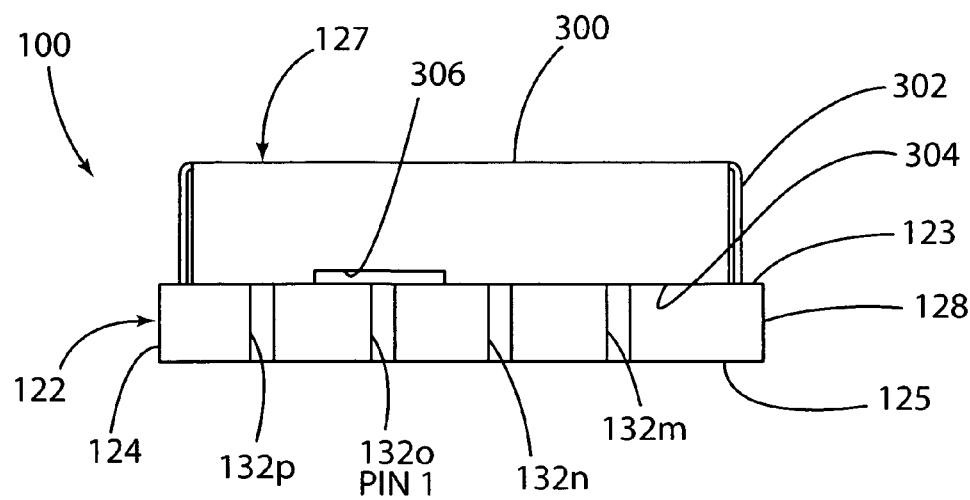
FIG. 4 is an enlarged side elevation view of the voltage controlled oscillator module of FIG. 1 with the lid secured thereto.

As shown in FIGS. 1 and 4, each of the castellations is defined by a generally semi-circularly shaped elongate groove which is formed in the respective side edges; extends between the top and bottom faces 123 and 125 of the board 122 in an orientation generally normal thereto; and is plated with a layer of conductive material so as to define a path for electrical signals between the top and bottom faces 123 and 125 of the board 122.

All but three of the castellations define ground pads or pins adapted to be seated against the respective ground pads or pins of a motherboard to which the module 100 is adapted to be direct surface mounted. More specifically, non-grounded castellation 132o, located generally centrally along bottom board side edge 130 and generally designated PIN 1 in FIGS. 1 and 3, defines the tuning voltage pin of module 100; non-grounded castellation 132g, located generally centrally along top board side edge 126 and generally designated PIN 2 in FIGS. 1 and 3, defines the RF output pin of module 100; and non-grounded castellation 132c, located generally centrally along board side edge 124 and generally designated PIN 3 in FIGS. 1 and 3, defines the supply voltage pin of module 100.

Figure 2:
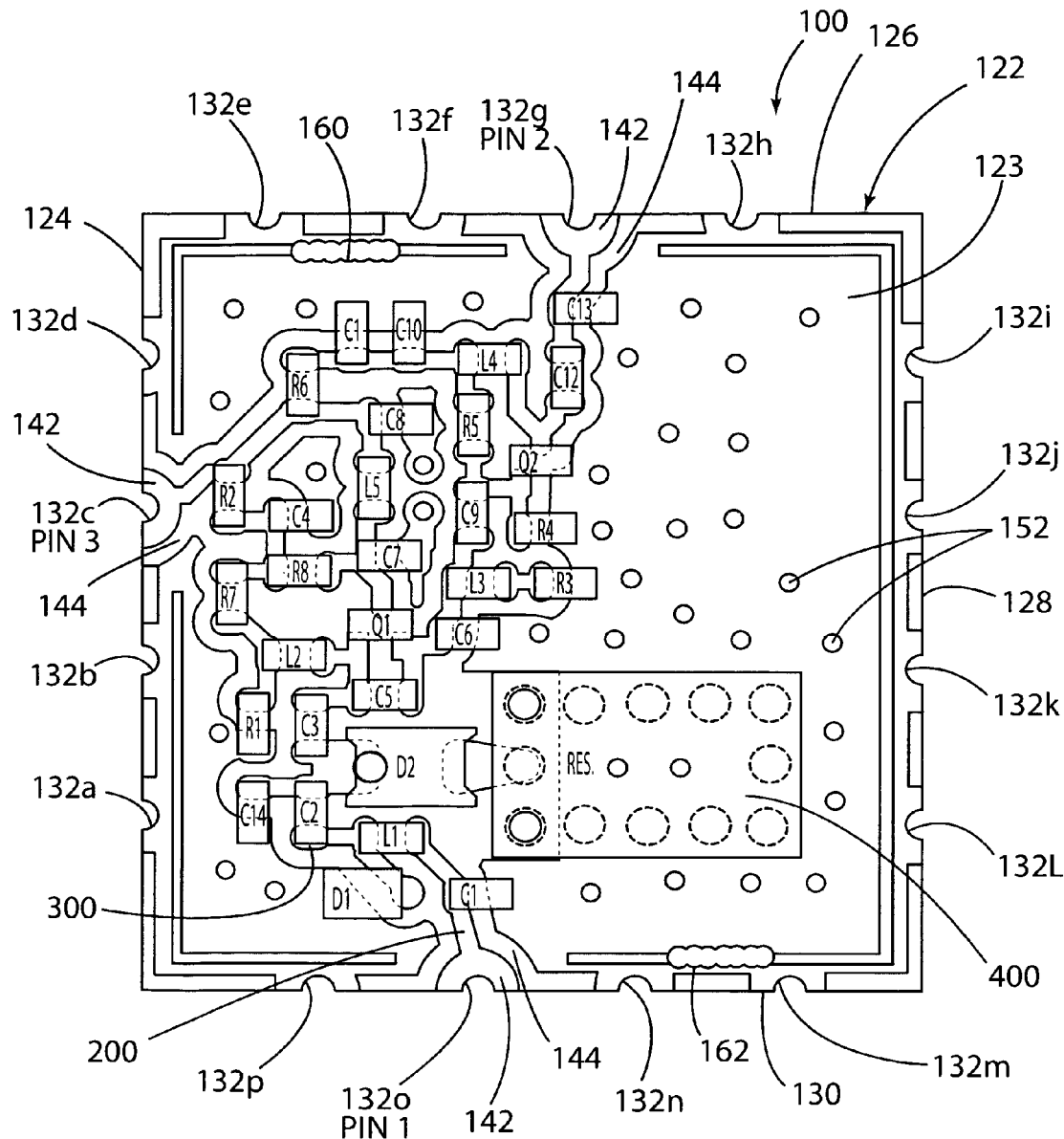
FIG. 2 is an enlarged plan view of the top face of the printed circuit board of the voltage controlled oscillator module of FIG. 1.
Figure 3:
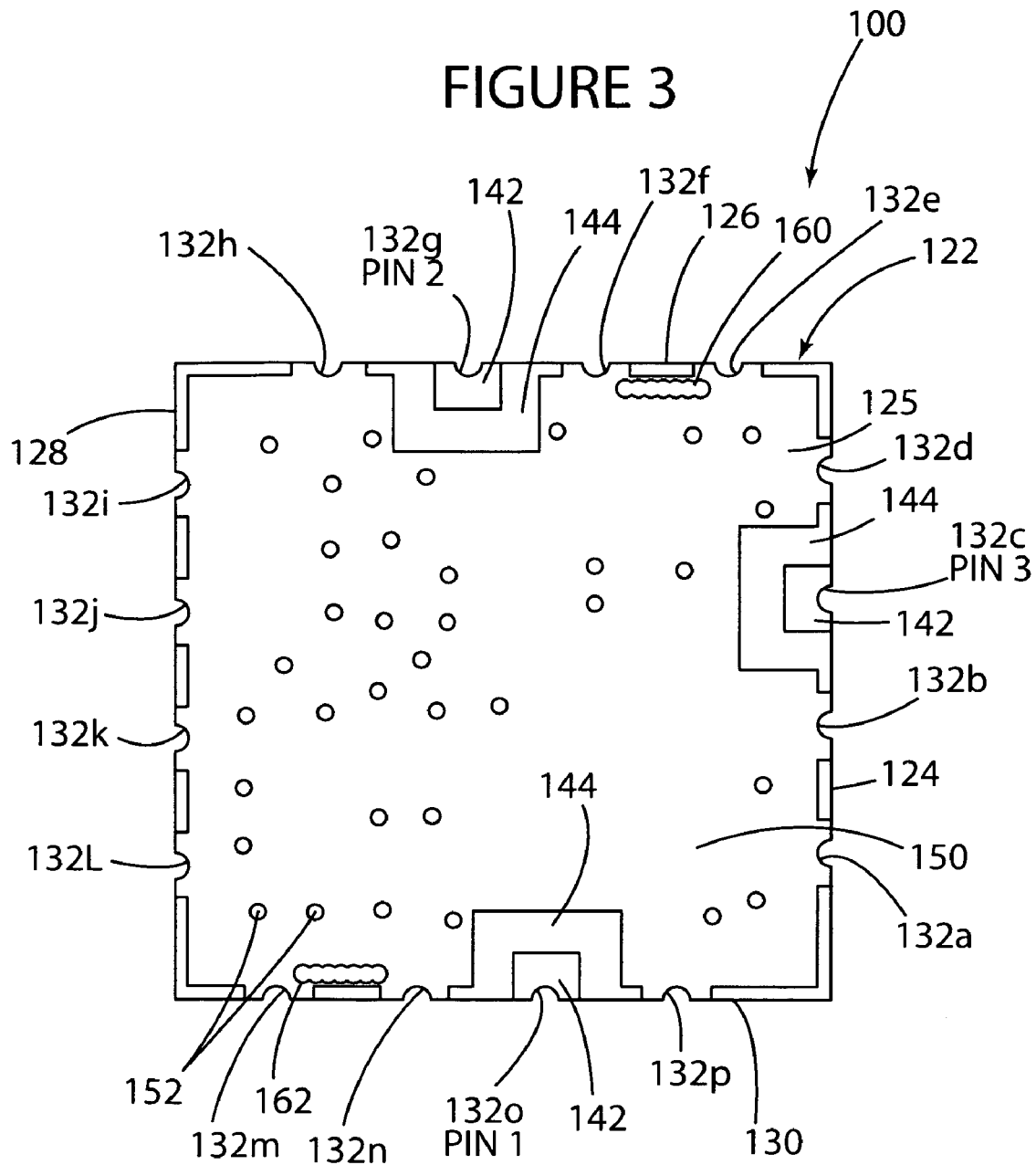
FIG. 3 is an enlarged plan view of the bottom face of the printed circuit board of the voltage controlled oscillator module of FIG. 1.

As shown in FIGS. 2 and 3, each of the grooves defined by the castellations 132c, 132g, and 132o in the respective top and bottom faces 123 and 125 is surrounded by a region/layer 142 of conductive material which, in turn, is surrounded by a region 144 which is devoid of conductive material so as to separate the respective non-ground pins from ground.

The operative specifications for the module 100 are summarized in Table 1 below.

TABLE 1

|  | Min | Typ | Max | Units |
| --- | --- | --- | --- | --- |
| Frequency | 2345 |  | 2590 | MHz |
| Tuning voltage range | 0.0 |  | 5.0 | VDC |
| Operating temperature range | −35 |  | 80 | ° C. |
| Supply voltage | 4.75 | 5.0 | 5.25 | VDC |
| Output power | −3 | 0 | 3 | dBm |
| Current drain |  |  | 30 | mA |

The identity of each of the electrical/electronic components mounted to the top face 123 of the board 122 of module 100 is summarized in Table 2 below. It is understood that the values of each of these components will be selected, varied, and changed by one of ordinary skill in the art depending upon the desired frequency of the oscillator.

TABLE 2

| Reference | Description |
| --- | --- |
| C1 | Capacitor |
| C2 | Capacitor |
| C3 | Capacitor |
| C4 | Capacitor |
| C5 | Capacitor |
| C6 | Capacitor |
| C7 | Capacitor |
| C8 | Capacitor |
| C9 | Capacitor |
| C10 | Capacitor |
| C11 | Capacitor |
| C12 | Capacitor |
| C13 | Capacitor |
| C14 | Capacitor |
| Q1 | Transistor |
| Q2 | Transistor |
| R1 | Resistor |
| R2 | Resistor |
| R3 | Resistor |
| R4 | Resistor |
| R5 | Resistor |
| R6 | Resistor |
| R7 | Resistor |
| R8 | Resistor |
| L1 | Inductor |
| L2 | Inductor |
| L3 | Inductor |
| L4 | Inductor |
| L5 | Inductor |
| RES | Resonator |
| D1 | Varactor |
| D2 | Varactor |

The layout and location of each of the electrical/electronic components on the printed circuit board 122 of the module 100 is shown in FIGS. 1-3, i.e., FIGS. 1 and 2 depicting the front or top face 123 of the board 122 and FIG. 3 depicting the back or bottom face 125 of the board 122.

Front face 123 has both a plurality of conductive wiring traces 200 (FIG. 2) formed thereon and a plurality of sites 300 (FIG. 2) formed thereon for mounting and interconnecting the plurality of electrical/electronic components which, as noted in Table 2 above, includes transistors, capacitors, resistors, inductors, varactors, and a resonator as described in more detail below.

A brief description of the location, placement and arrangement of the components mounted on the top face 123 of board 122 which define the oscillator follows although the same is fully disclosed and shown in FIGS. 1 and 2.

Generally speaking, and with reference to the board orientation depicted in FIG. 2 where the board side edges 126 and 130 define the top and bottom board edges and board side edges 124 and 128 define the left and right side edges respectively, it is understood that the ball grid array (BGA) resonator, generally designated 400, together with the other components defining the tank circuit portion (generally designated 500 in FIG. 5) of the module 100, are all located in the lower half of the top face 123 of the board 122 in a relationship generally adjacent and spaced from PIN 1 (the input tuning voltage pin).

Still more specifically, BGA resonator 400 is mounted on the board 122 in a relationship generally parallel to and spaced from board edge 130 in the region thereof bounded generally by PIN 1 on the left hand side and the board edge 128 on the right hand side. Ball grid array resonator 400 is of the type disclosed in co-pending U.S. Published patent application No.2008116981, the description and contents of which are expressly incorporated and repeated herein by reference.

The other components of the tank circuit 500, including C2, C14, D1, and D2, are all mounted on the board 122 in the region thereof bounded generally by PIN 1 on the right side and the board side edge 124 on the left side. Stated another way, the components C2, C14, D1, and D2 of tank circuit 500 are appropriately located and mounted in the lower left hand corner of the top face 123 of the board 122.

C3, a capacitor that couples the tank circuit 500 to the oscillator circuit 600, is also located and mounted on the board 122 in the lower left hand corner region thereof to the left of the resonator 400 and bounded generally by PIN 1 on the right and the board side edge 124 on the left.

L1 and C1, an inductor and capacitor respectively which in combination are adapted to attenuate undesired AC voltage fed through PIN 1, are also located and mounted on the board 122 in the lower left hand corner region thereof. More specifically, C1 is positioned between PIN 1 and the lower edge of resonator 400 while L1 is located to the left of C1 and between C2 and resonator 400.

Still referring to FIG. 2, all of the components on the board defining the oscillator circuit 600 (FIG. 5) of module 100, including components C4, C5, C7, C8, R1, R2, R3, R8, L2, L3, L5, and Q1, are generally located and mounted in the upper left hand corner of the top face 123 of the board 122 in the region thereof adjacent and to the right of PIN 3 and board side edge 124 and generally above the components defining tank circuit 500.

Module 100 still further incorporates a plurality of components on the board, including C6, C10, C11, C12, C13, R4, R5, R6, and Q2, which in combination define the buffer circuit 700 (FIG. 5) of the circuit of the VCO module 100 of the present invention. All of the components defining buffer circuit 700 are also preferably located and mounted in the upper left hand corner of the top face 123 of board 112 and, more particularly, in the region of top face 123 bounded by PIN 3 at the bottom, side edge 124 on the left, side edge 126 at the top, and PIN 2 on the right.

This particular arrangement and positioning of the various components defining the module 100 of the present invention in the lower half and upper left hand corner of the board 122 allows for high frequency performance with good phase noise characteristics.

Referring to FIG. 3, the lower face 125 of board 122 includes a ground layer of conductive material 150 which covers a majority of the surface thereof. Board 122 still further defines a plurality of conductive vias extending through the board 122 in a relationship generally normal to the top and bottom faces 123 and 125 thereof and defining a plurality of respective apertures 152 in both the top and bottom faces 123 and 125. The conductive vias 152 are plated with conductive material and serve the purpose of bringing the ground connections from the top 123 to the bottom 125 of the printed circuit board 122.

A pair of notches 160 and 162 are formed and extend through and between the surfaces 123 and 125 of the board 122 in a relationship adjacent and parallel to respective top and bottom board side edges 126 and 130. Notches 160 and 162 serve the purpose of accepting the tabs of the metal lid 127. Notch 160 is located along the board side edge 126 generally between castellations 132e and 132f. Notch 162 is located along board side edge 130 generally between castellations 132m and 132n. The notches are conductively plated.

Module 100 additionally comprises outer metal shield/lid 127 (FIG. 4) which is adapted to be fitted over the top face 123 of the board 122. Lid 127 includes a roof 300 and four respective peripheral sidewalls 302 depending generally normally downwardly therefrom. Although not shown in FIG. 4, it is understood that a pair of tabs extend outwardly from the end face of two of the sidewalls thereof which are adapted to be fitted into the respective notches 160 and 162 (FIG. 3). The notches and tabs in combination, of course, locate and secure the lid to the board 122. Lid 127 serves the purpose of a dust cover and a ground shield.

Each of the sidewalls 302 defines a peripheral edge 304. Three of the sidewalls 302 define respective notches 306 extending into the respective edge 304 thereof and appropriately positioned along the length of the respective sidewalls 302 so as to overlie the respective PINS 1, 2, and 3 and prevent any grounding between PINS 1-3 and the side walls of the lid 127. FIG. 4 depicts only the notch 306 adapted to overlie PIN 1.

Figure 5:
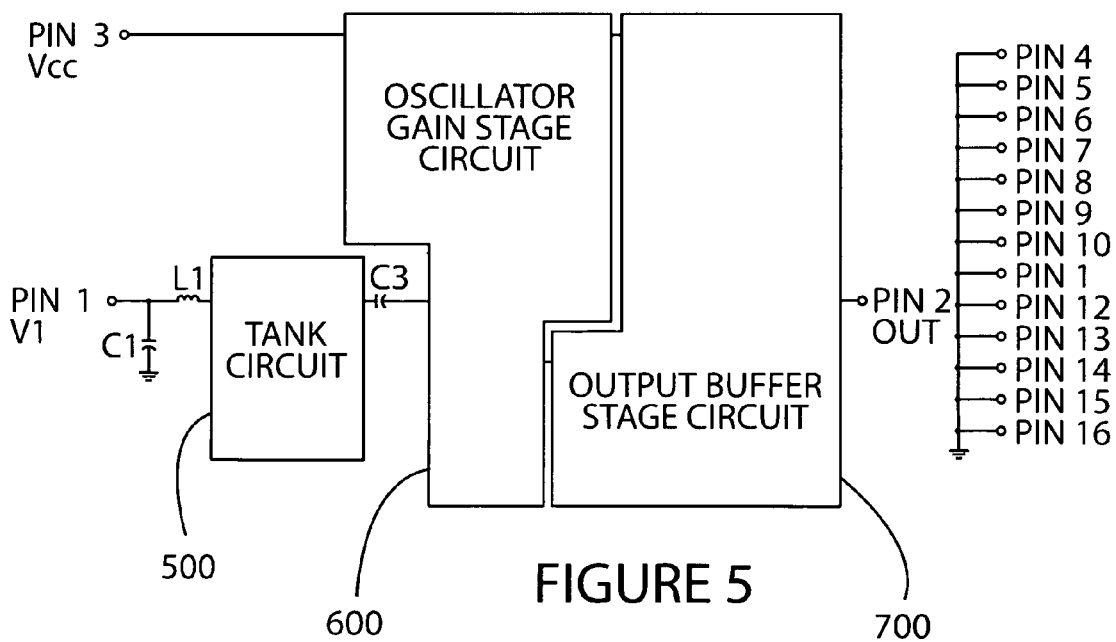
FIG. 5 is a simplified block schematic diagram of the electrical oscillator circuit of the voltage controlled oscillator module of FIG. 1.

FIG. 5 is a simplified block diagram of the electrical circuit of the oscillator module 100 of the present invention. The circuit is comprised of, and defined by, the plurality of electrical components described and shown above in FIGS. 1 and 2 and including capacitors (C), resistors (R), inductors (L), varactors (D), transistors (Q), and BGA resonator 400, all mounted on the top surface of the board 122.

As described briefly above, the oscillator circuit of module 100 comprises three major interconnected sections or circuits: tank circuit 500, oscillator gain stage circuit 600, and output buffer stage circuit 700. The tank circuit 500, of course, is actually part of the overall oscillator circuit shown in FIG. 5.

Generally, and referring to FIG. 5, the input end of tank circuit 500 is coupled to PIN 1 (the tuning voltage pin) via capacitor C1 and inductor L1 while the input end of the oscillator circuit 600 is coupled to PIN 3 (the supply voltage pin). The output end of tank circuit 500 is coupled to the output end of oscillator circuit 600 via capacitor C3 which, in turn, is coupled to the input end of buffer stage circuit 700 which, in turn, is coupled to both PIN 3 (the supply voltage pin) and PIN 2 (the RF output pin) at the output end thereof.

The components defining the oscillator circuit 600, including C4, C5, C7, C8, R1, R2, R3, R8, L2, L3, L5, and Q1 as shown in FIG. 2, are arranged and interconnected on the board in a standard Colpitts configuration and relationship.

The components defining the buffer stage circuit 700, including C6, C10, C11, C12, C13, R4, R5, R6, and Q2 as shown in FIG. 2, are also arranged and interconnected on the board 122 in a standard configuration and relationship.

Figure 6:
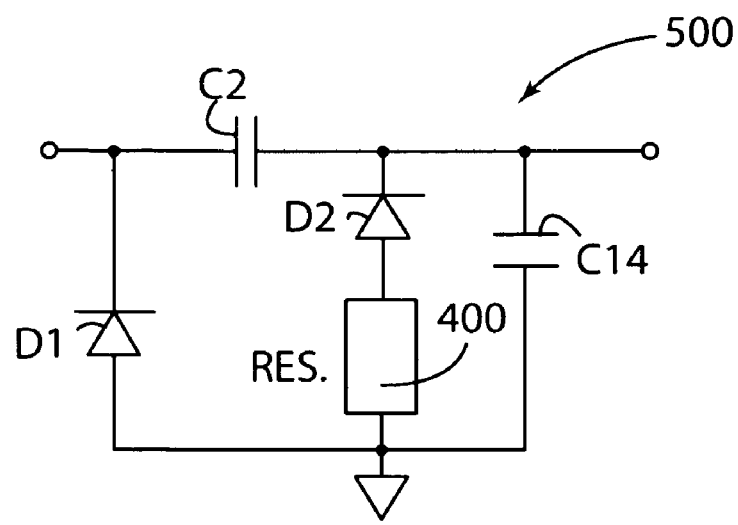
FIG. 6 is an enlarged schematic of the tank circuit of the voltage controlled oscillator circuit shown in FIG. 5.
Figure 7:
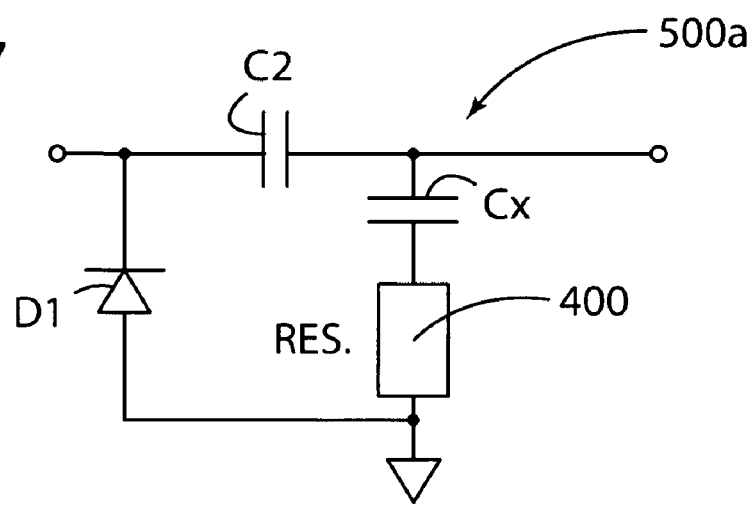
FIG. 7 is a schematic of another embodiment of the tank circuit of the voltage controlled oscillator circuit of FIG. 5.
Figure 8:
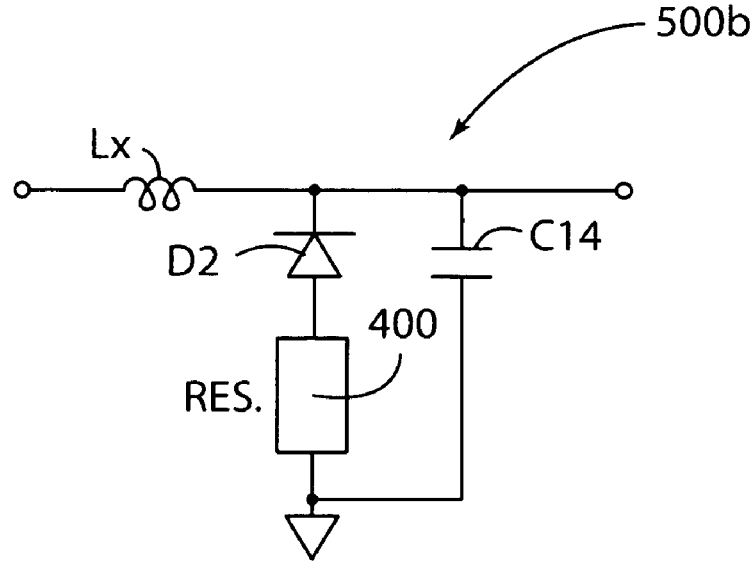
FIG. 8 is a schematic of yet another embodiment of the tank circuit of the voltage controlled oscillator circuit of FIG. 5.

FIG. 6 depicts a first tank circuit embodiment 500, while FIGS. 7 and 8 depict respective second and third tank circuit embodiments, generally designated 500a and 500b, in accordance with the present invention.

The tank circuit 500 shown in FIG. 6 includes a first varactor D1 in series with the resonator 400, a second varactor D2 in parallel with both the resonator 400 and varactor D1, a capacitor C14 in parallel with both the resonator 400 and varactor D1, and a capacitor C2 which in series couples varactor D1 to varactor D2. The end of resonator 400 opposite the end thereof connected to varactor D2 is coupled to ground.

In the tank circuit embodiment 500 of FIG. 6, the two varactors, D1 and D2, afford sufficient "ΔC vs. tuning voltage" to cover the 245 MHz frequency bandwidth plus an additional amount for manufacturability issues. The shunt capacitor C14 is used if an adjustment is needed in the circuit 500 to properly center the VCO frequency range. C2 is the main capacitor in the "LC" section. The BGA resonator 400 is in very close proximity to D2 to reduce parasitics in the circuit 500.

In the tank circuit 500, the combination of C2, D1, D2 and C14 accounts for the bulk of the effective capacitance of the circuit 500. The inductance from the shorted quarter wavelength BGA resonator 400 constitutes the bulk of the effective inductance in the tank circuit 500.

FIG. 7 depicts a tank circuit 500a where a capacitor Cx is positioned in series with the resonator 400, a varactor D1 is positioned in parallel with both the capacitor Cx and resonator 400, and a capacitor C2 interconnects varactor D1 and capacitor Cx in series. The end of resonator 400 opposite the end thereof coupled to capacitor Cx is coupled to ground.

In tank circuit 500a of FIG. 7, varactor D2 has been replaced with capacitor Cx which serves a similar function as the shunt capacitor C14 in circuit 500, i.e., effecting the frequency range adjustment. The effective total capacitance in the tank circuit 500a is created primarily from the combination of D1, C2 and Cx. This circuit configuration yields more pull range, i.e., frequency/tuning voltage, than tank circuit 500b described below.

The tank circuit 500b of FIG. 8 includes a varactor D2 in series with one end of the resonator 400 and a capacitor C14 in parallel with both the varactor D2 and the resonator 400. The other end of resonator 400 is coupled to ground.

In the circuit 500b of FIG. 8, D1 is eliminated. The capacitor C2 is also eliminated and replaced with inductor Lx. Inductor Lx, however, is not part of the tank circuit 500b. The function of inductor Lx, along with L1 (shown in FIG. 7), is to pass DC voltage and attenuate AC signals. Shunt capacitor C14 in this configuration is now the primary capacitor in the tank circuit. The effective total capacitance in the tank circuit 500b is created primarily from the combination of D2 and C14. This circuit configuration yields less pull range than circuit 500a. Circuit 500b is the currently preferred tank circuit of oscillator module 100.

Using this novel VCO design and tank circuit 500b, a typical phase noise of −140 dBc/Hz@ 1 MHz offset can be achieved in a 2345-2590 MHz VCO. This VCO has a bandwidth of 10%.

FIGS. 9-15 depict another voltage controlled oscillator module or assembly, generally designated 200, in accordance with the present invention which incorporates a phase-locked loop circuit and, in a manner similar to module 100, is also adapted for use in, for example, wireless infrastructure base stations and in various "point to point" and "point to multipoint" systems operating at frequencies between about 1 GHz and 6 GHz and bandwidths between about 3% and 20%.

The module 200, which can have a size of about 20.3 mm (length)×14.7 mm (width)×4.3 mm (height), includes a generally rectangular-shaped printed circuit board 222 including a top face 223 (FIGS. 9, 10, and 13) on which all of the electrical and electronic components defining the oscillator are appropriately mounted and interconnected together with a metal lid or shield 227 (FIG. 13) which covers all of the components. Although not shown, it is understood that the printed circuit board 222 is a GETEK™ board made of a plurality of conventional electrically insulative laminates (three are preferable for this design).

Printed circuit board 222 (FIGS. 9, 10, 12, and 13) includes respective front and back (top and bottom) faces 223 and 225 and respective elongate side peripheral edges 224, 226, 228 and 230.

A first plurality of castellations 232a-f (FIG. 10) defining direct surface mount pads or pins are formed and extend along the length of the board side edge 230 of the board 222 in spaced-apart and parallel relationship from board side edge 230 to board side edge 226.

A second plurality of castellations 232g-L, also defining respective direct surface mount pads or pins are formed and extend along the length of the board side edge 224 in spaced-apart and parallel relationship from and between board side edge 226 to board side edge 230A.

Castellations 232a-f and castellations 232g-L are diametrically opposed to each other.

Figure 9:
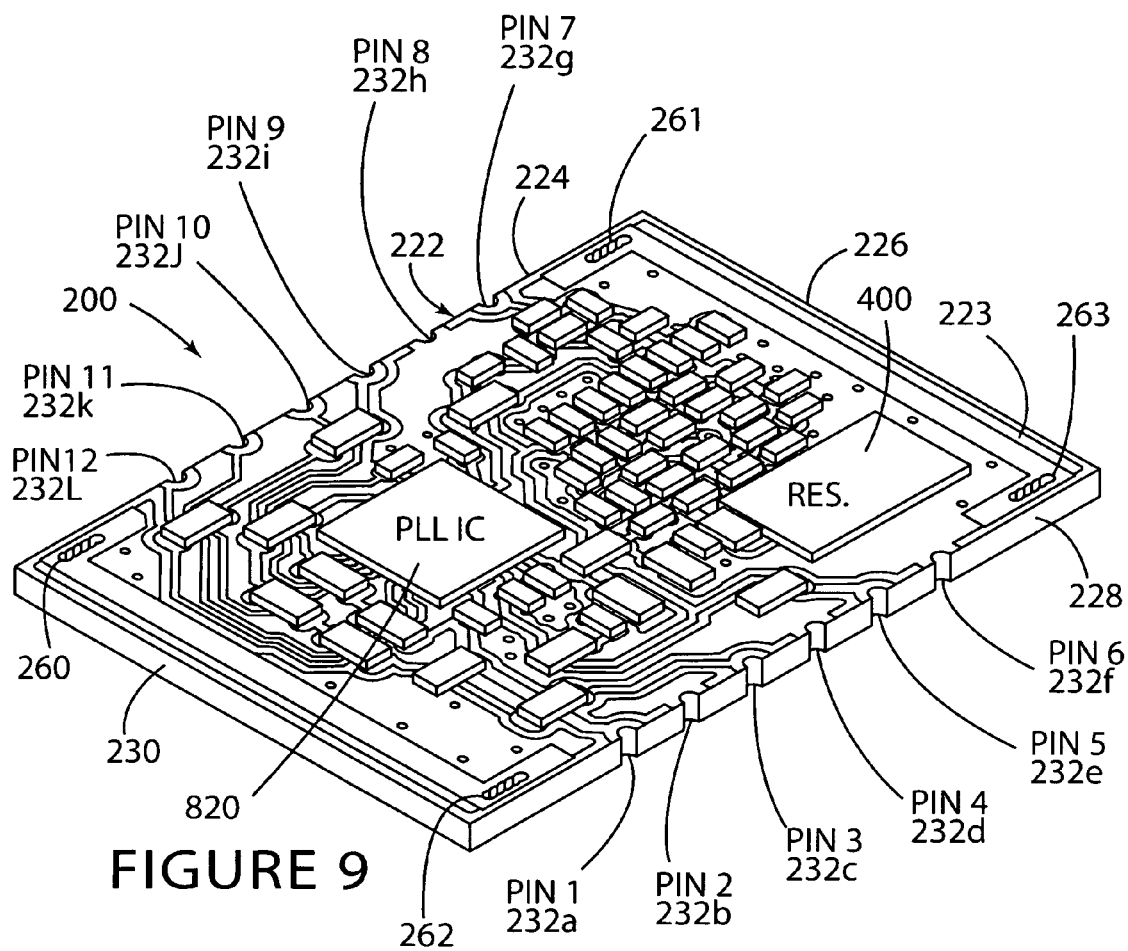
FIG. 9 is an enlarged perspective view of an embodiment of a voltage controlled oscillator module of the present invention without the lid and including a phase-locked loop circuit.
Figure 13:
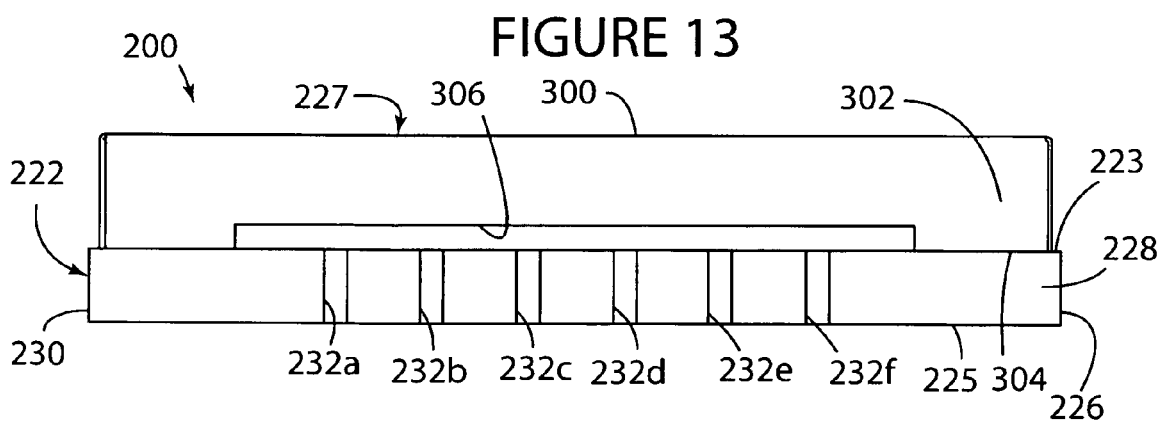
FIG. 13 is an enlarged side elevation view of the voltage controlled oscillator module of FIG. 9 with the lid secured thereto.

Each of the castellations, as shown in FIGS. 9 and 13, is defined by a generally semi-circularly-shaped elongate groove which is formed in the respective side edges; extends between the top and bottom faces 223 and 225 of the board 222 in an orientation generally normal thereto; and is plated with a layer of conductive material so as to define a path for electrical signals between the top and bottom faces 223 and 225 of the board 222.

Figure 10:
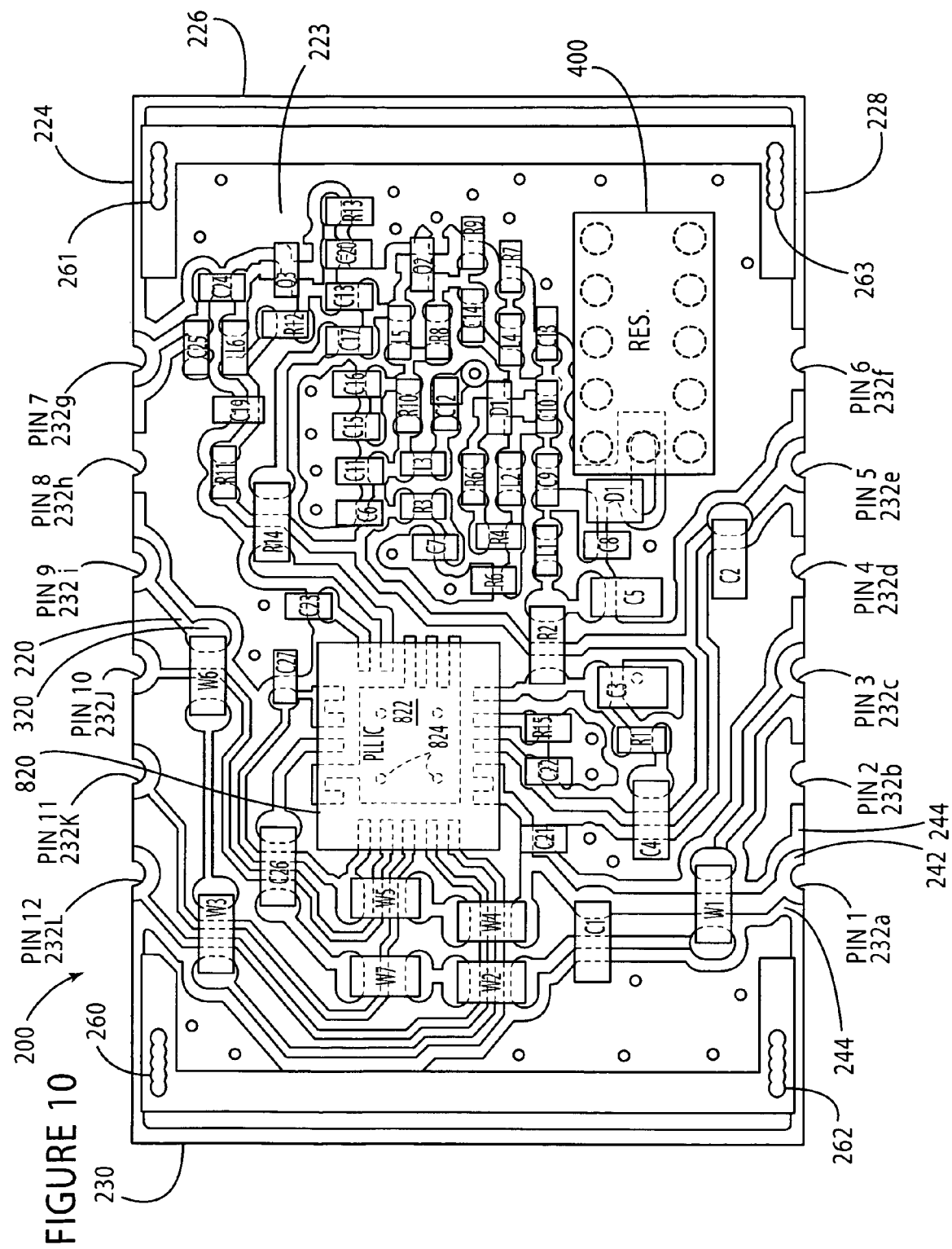
FIG. 10 is an enlarged plan view of the top face of the printed circuit board of the voltage controlled oscillator module of FIG. 9.

The castellations are adapted to be seated against the respective ground pads or pins of a motherboard to which the module 200 is adapted to be direct surface mounted. More specifically, and as shown in FIG. 10, castellation 232a defines a supply voltage pin (PIN 1) for the phase-locked loop integrated circuit 820. Castellation 232b defines a ground pin (PIN 2). Castellation 232c defines a reference signal input pin (PIN 3) for the phase-locked loop integrated circuit 820. Castellation 232d defines a ground pin (PIN 4).

Figure 14:
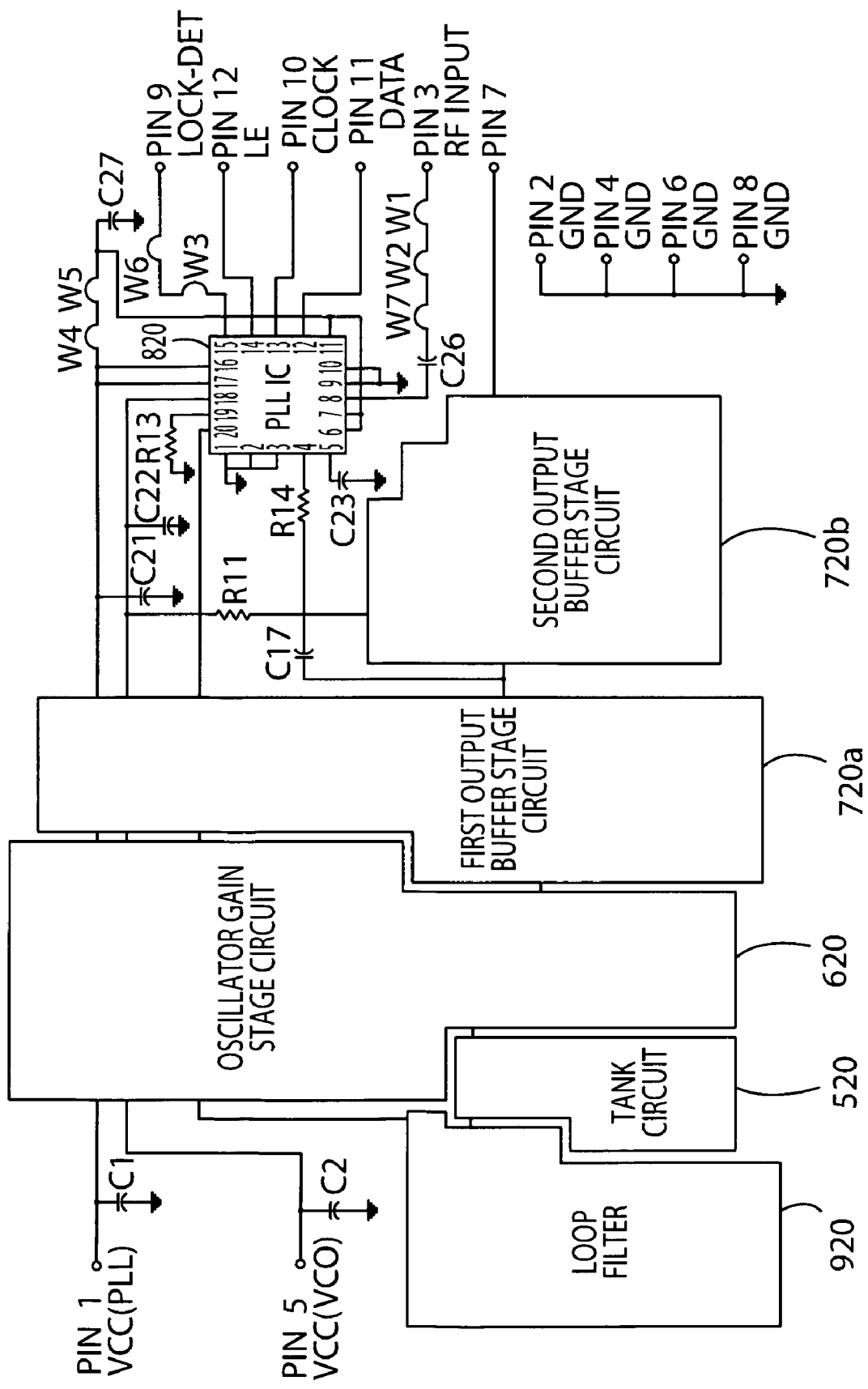
FIG. 14 is a simplified block schematic diagram of the electrical oscillator circuit of the voltage controlled oscillator module of FIG. 9.

Castellation 232e defines a supply voltage pin (PIN 5) for the voltage controlled oscillator circuit 620 (FIG. 14). Castellation 232f defines a ground pin (PIN 6). Castellation 232g defines an RF frequency signal output pin (PIN 7). Castellation 232h defines a ground pin (PIN 8). Castellation 232i defines a lock detect pin (PIN 9). Castellation 232j defines a clock pin (PIN 10). Castellation 232k defines a data pin (PIN 11). Castellation 232L defines a load enable pin (PIN 12).

Figure 12:
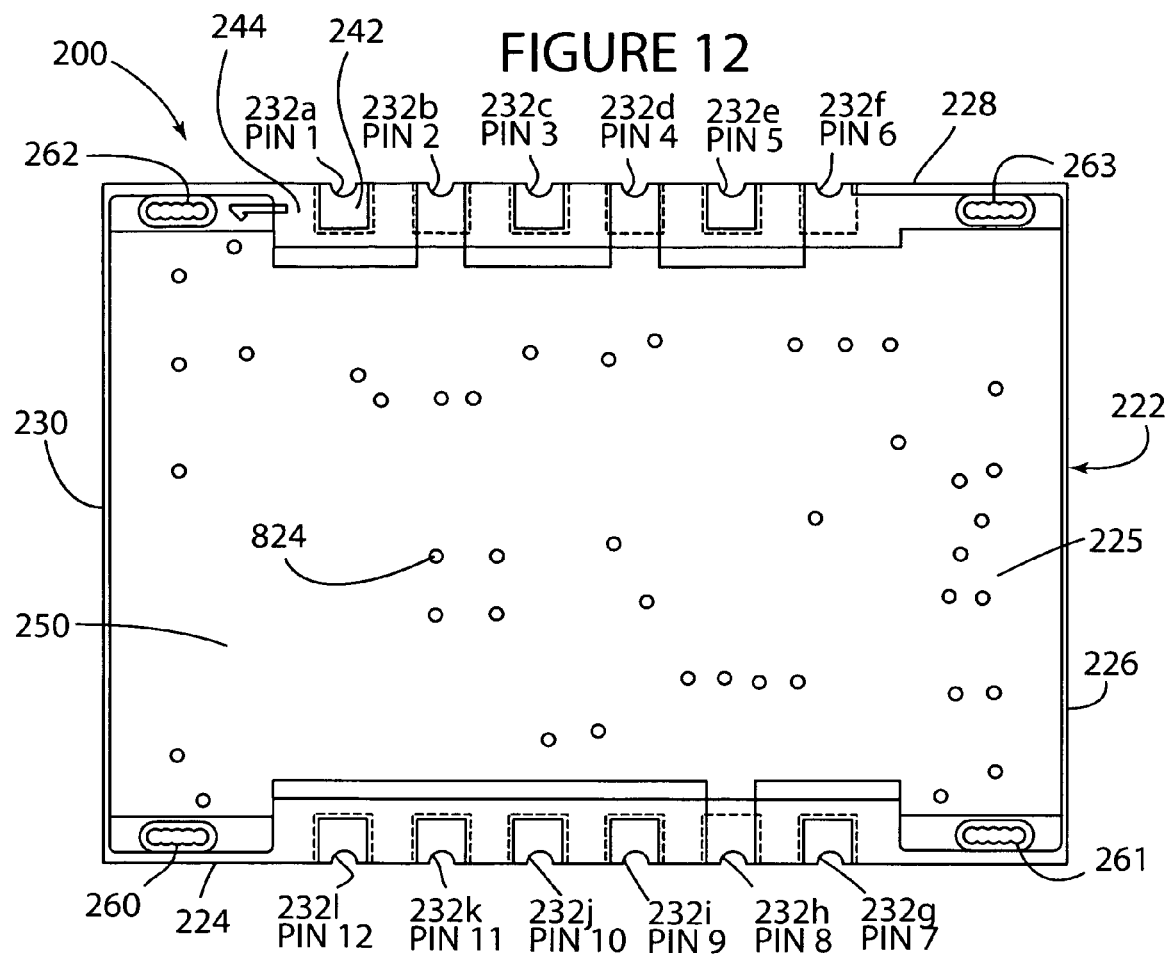
FIG. 12 is an enlarged plan view of the bottom face of the printed circuit board of the voltage controlled oscillator module of FIG. 9.

As shown in FIGS. 10 and 12, each of the grooves defined by the non-grounded castellations 232a, 232c, 232e, 232g, and 232i in the respective top and bottom faces 223 and 225 is surrounded by a region/layer 242 of conductive material which, in turn, is surrounded by a region 244 which is devoid of conductive material so as to separate the respective input and output pins from ground.

The operative specifications for the module 200 are summarized in Table 3 below.

TABLE 3

|  | Min | Typ | Max | Units |
|---|---|---|---|---|
| Frequency | 3230 |  | 3430 | MHz |
| Operating temperature range | −40 |  | 85 | ° C. |
| Supply voltage | 4.75 | 5.0 | 5.25 | VDC |
| Output power | 2 | 5 | 8 | dBm |
| Current drain |  |  | 55 | mA |
| Phase Noise @ 10 kHz offset |  | −96 |  | dBc/Hz |

The identity of each of the electrical/electronic components mounted to the top face 223 of the board 222 of module 200 as shown in FIGS. 9 and 10 and defining the various circuits of the oscillator module 200 is summarized in Table 4 below. It is understood that the values of each of these components will be selected, varied, and changed by one of ordinary skill in the art depending upon the desired frequency of the oscillator.

TABLE 4

| Reference | Description |
|---|---|
| C1 | Capacitor |
| C2 | Capacitor |
| C3 | Capacitor |
| C4 | Capacitor |
| C5 | Capacitor |
| C6 | Capacitor |
| C7 | Capacitor |
| C8 | Capacitor |
| C9 | Capacitor |
| C10 | Capacitor |
| C11 | Capacitor |
| C12 | Capacitor |
| C13 | Capacitor |
| C14 | Capacitor |
| C15 | Capacitor |
| C16 | Capacitor |
| C17 | Capacitor |
| C18 | Capacitor |
| C19 | Capacitor |
| C20 | Capacitor |
| C21 | Capacitor |
| C22 | Capacitor |
| C23 | Capacitor |
| C24 | Capacitor |
| C25 | Capacitor |
| C26 | Capacitor |
| C27 | Capacitor |
| R1 | Resistor |
| R2 | Resistor |
| R3 | Resistor |
| R4 | Resistor |
| R5 | Resistor |
| R6 | Resistor |
| R7 | Resistor |
| R8 | Resistor |
| R9 | Resistor |
| R10 | Resistor |
| R11 | Resistor |
| R12 | Resistor |
| R13 | Resistor |
| R14 | Resistor |
| R15 | Resistor |
| C27 | Capacitor |
| L1 | Inductor |
| L2 | Inductor |
| L3 | Inductor |
| L4 | Inductor |
| L5 | Inductor |
| L6 | Inductor |
| W1 | Jumper |
| W2 | Jumper |
| W3 | Jumper |
| W4 | Jumper |
| W5 | Jumper |
| W6 | Jumper |
| W7 | Jumper |
| 400 | Resonator |
| 820 | Integrated Circuit |
| Q1 | Transistor |
| Q2 | Transistor |
| Q3 | Transistor |
| D1 | Varactor |
| D2 | Varactor |

The layout and location of each of the electrical/electronic components mounted to and defined on the printed circuit board 222 of the module 200 is shown in FIGS. 9, 10, and 12, i.e., FIGS. 9 and 10 depicting the front or top face 223 of the board 222 and FIG. 12 depicting the back or bottom face 225 of the board 222.

Front face 223 has both a plurality of conductive wiring traces 220 formed thereon and a plurality of sites 320 formed thereon for mounting and interconnecting the plurality of electrical/electronic components which, as noted in Table 4 above, includes capacitors, resistors, inductors, varactors, transistors, ICs, jumpers and a resonator as described in more detail below.

A brief description of the location, placement and arrangement of the components defined on and mounted to the top face 223 of board 222 follows although the same is fully disclosed and shown in FIG. 10.

Generally speaking, and with reference to the board orientation depicted in FIG. 10 where the board side edges 224 and 228 define the top and bottom board edges, respectively, and board side edges 230 and 226 define the left and right side edges, respectively, it is understood that the ball grid array (BGA) resonator, generally designated 400, together with the other components defining the tank circuit portion (generally designated 520, FIG. 14) of the module 200, are all generally located in the lower half of the top face 223 of the board 222 in a relationship adjacent and spaced from PIN 5.

More specifically, resonator 400 extends in a relationship generally spaced from and parallel to bottom edge 228 and occupies the lower right hand corner space of the board defined by PIN 5 on the left side and the board side edge 226 on the right side.

Ball grid array resonator 400 is similar in structure to the type disclosed in co-pending U.S. Published patent application No. 2008116981, the description and contents of which are expressly incorporated and repeated herein by reference.

The other components of the tank circuit 520, including varactor D1 and capacitor C8 are mounted on the board 222 adjacent to, and to the left of, ball grid array resonator 400.

C9, a capacitor that couples the tank circuit 520 to the oscillator circuit 620, is also located and mounted on the board 222 to the left and above resonator 400.

Still referring to FIG. 10, all of the components defining the oscillator circuit 620 of module 200, including components C6, C7, C8, C10, C11, C12, R3, R4, R5, R6, R7, L2, L3, L4, and Q1, are generally located and mounted on the right hand portion of the top face 223 of the board 222 in a region thereof bounded generally by the phase-locked loop circuit 820 on the left side, the resonator 400 on the bottom, and the board edge 226 on the right side.

Module 200 still further incorporates a plurality of components, including C13, C14, C15, C16, R8, R9, R10, L5, and Q2, which in combination define a first buffer circuit or stage 720a (FIG. 14) of the VCO/PLL module 200. All of the components defining first buffer circuit 720a are preferably located and mounted in the same region as the components of the oscillator circuit 620.

A second buffer stage or circuit 720b (FIG. 14) is comprised of several components, including C18, C19, C20, C24, C25, R12, R13, L6, and Q3, which in combination define a second buffer circuit of the circuit of the VCO/PLL module 200 of the present invention. All of the components defining second buffer circuit 720b are preferably located and mounted in the upper right corner of the top face 223 of the board 222 adjacent and below PIN 7 and in an area or region of the board 222 bounded by the PLL IC 820 on the left, the board edge 226 on the right, the first buffer stage 720a below, and the top board edge 224 above.

Several capacitors C1, C2, C21, C22 and C27 and a resistor R11 are used to attenuate undesired AC voltage fed through power supply pins PIN 1 and PIN 5. They are located and mounted on the top face 223 in various locations around board 222.

The phase-locked loop integrated circuit (PLL IC) 820 is mounted to face 223 in a general central region of the board 222 below PINS 10 and 11 and above PINS 2 and 3. PLL IC 820 is commercially available as part number ADF4113 from Analog Devices in Norwood, Mass.

Figure 11:
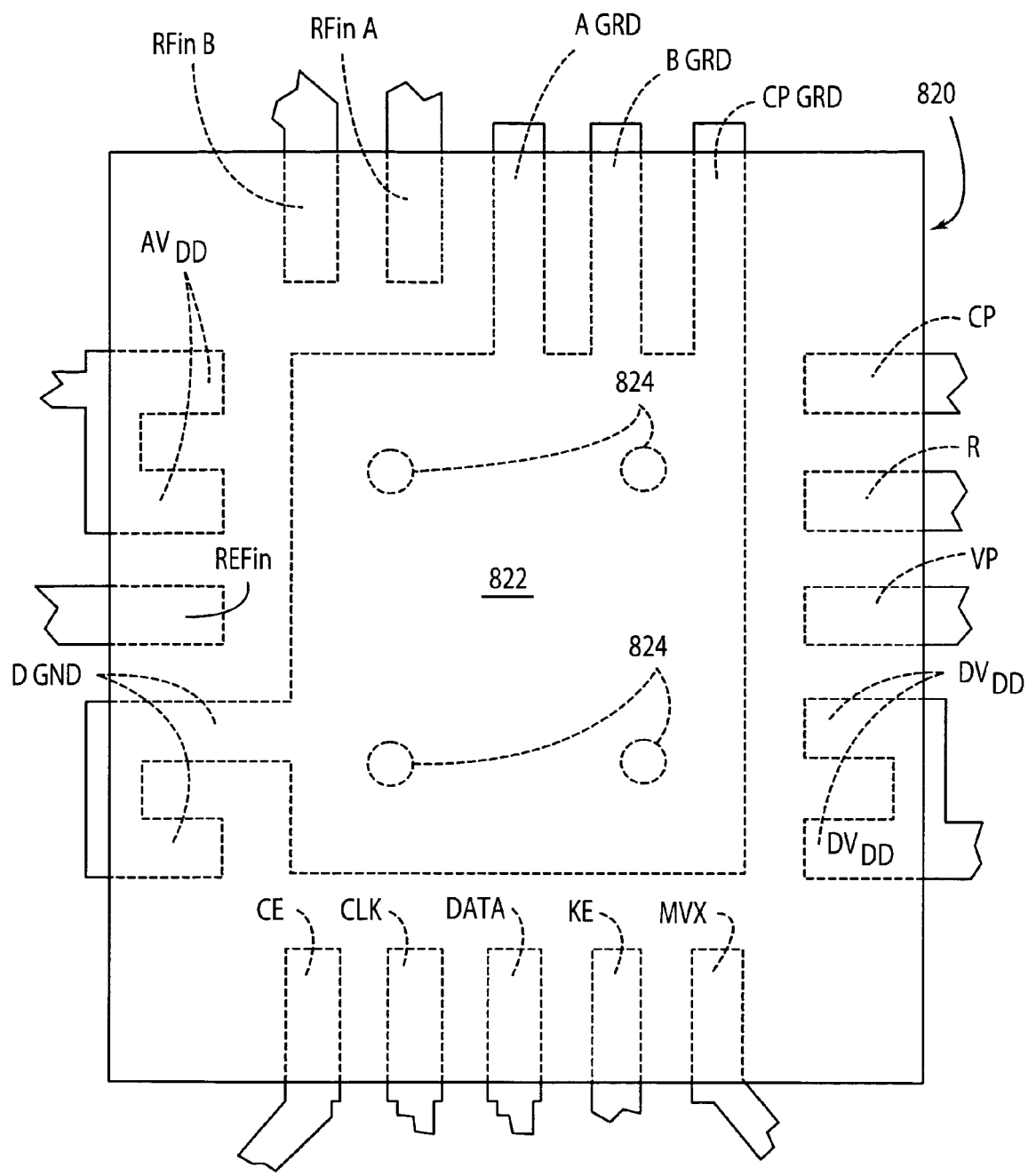
FIG. 11 is an enlarged, broken top plan view of the phase-locked loop integrated circuit of the voltage controlled oscillator module of FIG. 9.

As shown in FIG. 11, PLL IC 820 includes terminals CP GND, A GND, and D GND that are connected to metallized area 822. Plated through-holes 824 connect metallized area 852 in common with ground pins PIN 2, PIN 4, PIN 6 and PIN 8 through ground plane 225. Terminals AV DD and DV DD are connected to PIN 1, the supply voltage. Terminal REFin is connected to PIN 3 through capacitor C26. Terminal VP is connected to PIN 5. Terminal R is connected to resistor R 5. Terminal CP is connected to capacitor C3 and resistor R1. Terminal RFin A is connected to resistor R14. Terminal RFin B is connected to capacitor C23. Terminal MVX is connected to PIN 9, the lock detect pin. Terminal LE is connected to PIN 12, the load enable pin. Terminal DATA is connected to PIN 11, the data pin and terminal CLK is connected to PIN 10, the clock pin. Terminal CE is connected to PIN 1, the power supply pin.

Pins PIN 10, PIN 11, and PIN 12 define the digital input lines that allow PLL IC 820 to be programmed to the desired output frequency. PIN 9 is the lock detect pin that indicates whether the PLL IC 820 is in lock or not. PIN 3 is the reference input frequency line to the PLL IC 820.

A loop filter 920 (FIG. 14) is coupled to PLL IC 820. Loop filter 920 can include components C3, C4, C5, R1, and R2 which are preferably located and mounted on top face 223 in a region thereof bounded by PLL IC 820 above, board edge 228 below, resonator 400 to the right, and board edge 230 to the left. Various circuit lines connect loop filter 920 between PLL IC 820 and tank circuit 520.

Several jumpers W1, W2, W3, W4, W5, W6 and W7 are used to make electrical connections between circuit lines 220 while going over other circuit lines 220 that are not desired to be connected. Jumpers W1-W7 are located and mounted on the top face 223 generally to the left and above PLL IC 820 on board 222. More specifically, jumper W1 is located generally across and spaced from PIN 1; jumpers W2, W4, W5, and W6 are located generally across, spaced from, and to the left of, PLL IC 820; and jumpers W3 and W6 are located generally above PLL IC 820 with the jumper W3 being located generally opposite PIN 12 and jumper W6 being located generally opposite PIN 10.

This particular arrangement and positioning of the various components defining the module 200 allows for high frequency performance with good phase noise characteristics.

Referring to FIG. 12, the lower face 225 of board 222 includes a ground layer of conductive material 250, which covers a majority of the surface thereof. Board 222 still further defines a plurality of plated through-holes 824 that extend through the board 222 in a relationship generally normal to the top and bottom faces 223 and 225. The plated through-holes 824 are plated with conductive material and serve the purpose of bringing the ground connections from the top surface 223 to the bottom surface 225 of the printed circuit board 222.

The lower face 225 still further defines four notches 260, 261, 262 and 263 formed at each corner of board 222. Notches 260-263 extend through the surfaces 223 and 225 and serve the purpose of accepting the tabs of the metal lid 227. The notches are conductively plated.

Module 200 additionally comprises outer metal shield/lid 227 (FIG. 13) which is adapted to be fitted over the top face 223 of the board 222. Lid 227 includes a roof 300 and four respective peripheral sidewalls 302 depending generally normally downwardly therefrom. Although not shown in FIG. 13, it is understood that a pair of tabs extend outwardly from the end face of two of the sidewalls thereof which are adapted to be fitted into the respective notches 260-263 defined in the top face 223 of the board 222. The notches and tabs in combination, of course, locate and secure the lid 227 to the board 222. Lid 227 serves the purpose of a dust cover and a ground shield.

Each of the sidewalls 302 defines a peripheral edge 304. Each of the two long sidewalls 302 defines an elongate notch 306 extending into the respective edge 304 thereof and appropriately positioned along the length of each of the respective long sidewalls 302 so as to overlie and be spaced from the respective pins and prevent any grounding between the pins and the lid 227. FIG. 13 depicts only the notch 306 in the wall 302 which overlies and is spaced from the vias 232a-232f. Although not shown in any of the FIGURES, it is understood that opposed long sidewall 302 likewise includes a similar notch 306 which overlies and is spaced from vias 232g-232i.

FIG. 14 is a simplified block diagram of the electrical circuit of the oscillator module 200. The circuit is comprised of the plurality of electrical components described above and shown in FIGS. 9 and 10 and including an integrated circuit (IC), capacitors (C), resistors (R), inductors (L), varactors (D), transistors (Q), and BGA resonator 400.

As described briefly above, the oscillator circuit of module 200 comprises five major interconnected sections or circuits: tank circuit 520, oscillator gain stage circuit 620, first output buffer stage circuit 720a, second output buffer stage circuit 720b, phase-locked loop circuit 820 and loop filter 920. The tank circuit 520 is part of the overall oscillator circuit shown in FIG. 14.

Generally, and referring to FIG. 14, PINS 1 and 5 are coupled to the input of oscillator gain stage circuit 620. The input of oscillator gain stage circuit 620 is coupled to the loop filter 920 and the output of the oscillator gain stage circuit 620 is coupled to the first buffer stage circuit 720a and the input end of tank circuit 520 is coupled to the output end of loop filter 920. The output of tank circuit 520 is coupled to the input of oscillator circuit 620. The output of oscillator circuit 520 is coupled to the input of first buffer stage circuit 720a. The output of first buffer stage circuit 720a is coupled to the input of second buffer stage 720*b* and the phase-locked loop circuit 820. The output of second buffer stage 720*b* and thus the output frequency signal is provided to PIN 7, which is associated with castellation 232*g*. A portion of the output frequency signal is fed back from buffer circuit 720*b* to phase-locked loop circuit 820. A node is connected to terminal RF of phase-locked loop circuit 820. The output of phase-locked loop circuit 820 on terminal CP is fed to the input of loop filter 920. PINS 3, 9, 10, 11, and 12 are coupled to phase-locked loop circuit 820. PINS 2, 4, 6, and 8 are all coupled to ground.

The components defining the oscillator circuit 620, including C6, C7, C9, C10, C11, C12, R3, R4, R5, R6, R7, L2, L3, L5, and Q1, are arranged and interconnected in a conventional Colpitts oscillator configuration and relationship. Other oscillator configurations such as Pierce and Clapp could also be used without any loss in performance.

The components defining the first buffer stage circuit 720*a*, including C13, C14, C15, C16, R8, R9, R10, L5 and Q2, are also arranged and interconnected in a conventional configuration and relationship.

The components defining the second buffer stage circuit 720*b*, including C18, C19, C20, C24, C25, R12, R13, L6 and Q3, are also arranged and interconnected in a conventional configuration and relationship.

Figure 15:
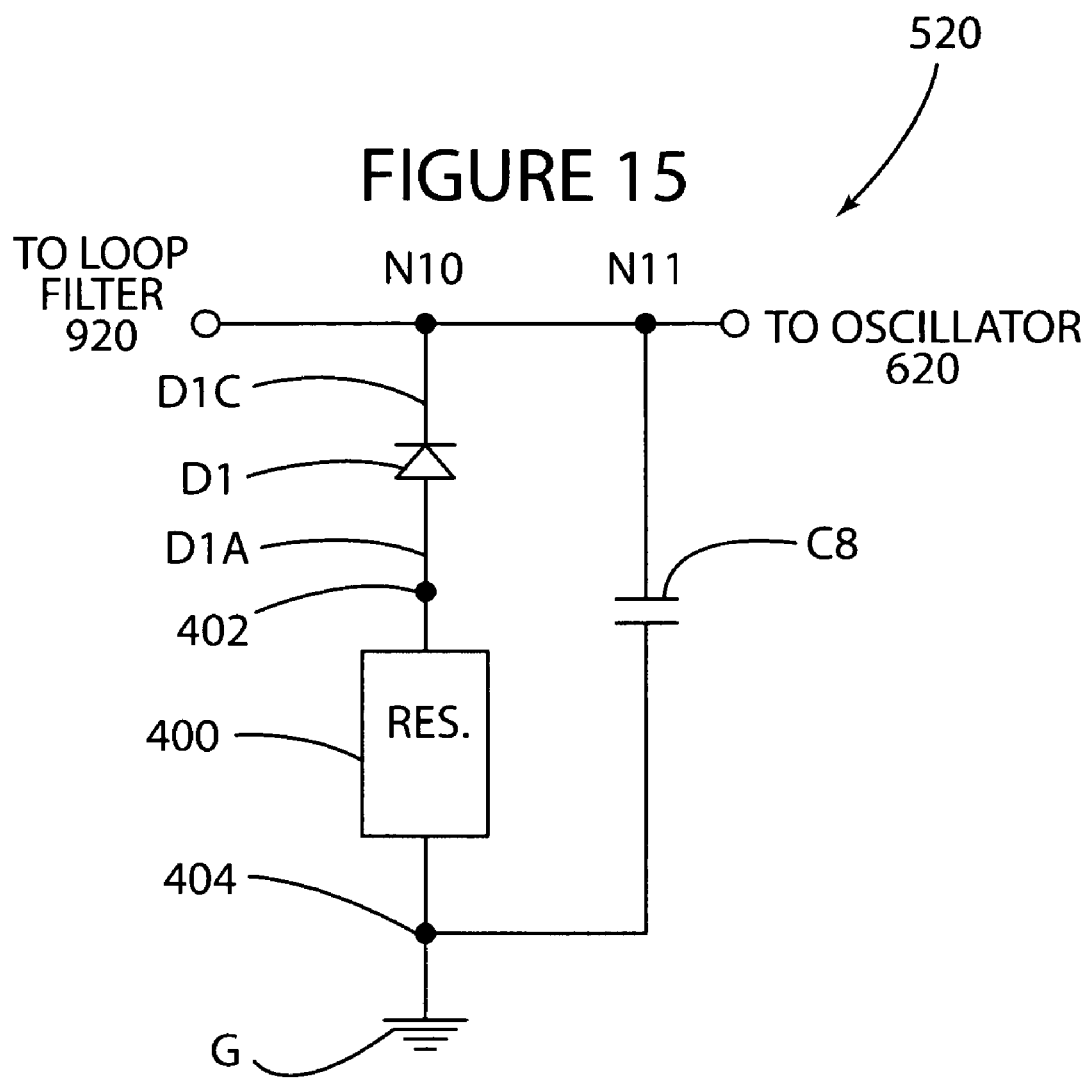
FIG. 15 is an enlarged schematic of the tank circuit of the voltage controlled oscillator circuit shown in FIG. 14.

FIG. 15 depicts an enlarged view of one embodiment and arrangement of the elements of tank circuit 520 in accordance with the present invention. Tank circuit 520 includes a varactor D1 that is in series with resonator 400. Varactor D1 has an anode D1A and a cathode D1C. Cathode D1C is connected to node N10 and anode D1A is connected to resonator terminal 402. Capacitor C8 is coupled in parallel across the series combination of both resonator 400 and varactor D1. Capacitor C8 is connected between node N11 and resonator terminal 404. Resonator terminal 404 is further coupled to ground G. Nodes N10 and N11 are further coupled to loop filter 920 and oscillator 620.

In tank circuit embodiment 520, the varactor D1 allows for a sufficient change in capacitance in response to the input tuning voltage to cover the 245 MHz frequency bandwidth plus an additional amount for manufacturability issues. The shunt capacitor C8 is used if an adjustment is needed in tank circuit 520 to properly center the oscillator frequency range. The BGA resonator 400 is mounted in close proximity to varactor D2 in order to reduce parasitic capacitance and inductance in tank circuit 520.

Numerous variations and modifications of the embodiment described above may be effected without departing from the spirit and scope of the novel features of the invention. No limitations with respect to the specific module illustrated herein are intended or should be inferred.

We claim:

1. An oscillator assembly comprising:
a circuit board;
a voltage controlled oscillator defined on the circuit board;
a tank circuit defined on the circuit board and defining at least a portion of the voltage controlled oscillator, the tank circuit including first and second varactors and first and second capacitors mounted to the circuit board, the first varactor being positioned in series with a ball grid array resonator mounted to the circuit board and defining a portion of the tank circuit and in parallel with the second varactor and the first capacitor, the second capacitor being positioned in series between the first and second varactors.

2. An oscillator assembly comprising:
a circuit board;
a voltage controlled oscillator defined on the circuit board;
a tank circuit defined on the circuit board and defining at least a portion of the voltage controlled oscillator, the tank circuit including first and second capacitors and a varactor mounted to the circuit board, said first capacitor being positioned in series with a ball grid array resonator mounted to the circuit board and defining a portion of the tank circuit and the varactor being positioned in parallel with the first capacitor and the resonator, the second capacitor being positioned in series between the varactor and the first capacitor.

3. An oscillator assembly comprising:
a circuit board;
a voltage controlled oscillator defined on the circuit board;
a tank circuit defined on the circuit board and defining at least a portion of the voltage controlled oscillator, the tank circuit including a varactor mounted to the circuit board which is positioned in series with a ball grid array resonator mounted to the circuit board and defining a portion of the tank circuit and a capacitor also mounted to the circuit board which is positioned in parallel with both the varactor and the ball grid array resonator.

4. An oscillator assembly comprising:
a circuit board;
a voltage controlled oscillator defined on the circuit board;
a tank circuit defined on the circuit board and defining at least a portion of the voltage controlled oscillator, the tank circuit includes a varactor and a capacitor mounted to the circuit board, the varactor being connected in series with a ball grid array resonator mounted to the circuit board and defining a portion of the tank circuit and in parallel with the capacitor.

\* \* \* \* \*

UNITED STATES PATENT AND TRADEMARK OFFICE
CERTIFICATE OF CORRECTION

PATENT NO.       : 7,646,255 B2
APPLICATION NO.  : 11/985132
DATED            : January 12, 2010
INVENTOR(S)      : Robert A Jacobson et al.

Page 1 of 1

It is certified that error appears in the above-identified patent and that said Letters Patent is hereby corrected as shown below:

Column 11, line 37, "R 5" should be changed to --R15--
Column 12, line 44, "232i" should be changed to --232l--

Signed and Sealed this
Thirteenth Day of March, 2012

David J. Kappos
*Director of the United States Patent and Trademark Office*